United States Patent [19]

Itoh

[11] Patent Number: 4,879,510
[45] Date of Patent: Nov. 7, 1989

[54] ELECTRICAL INDICATOR HAVING AN OPTICAL POSITION ENCODER

[75] Inventor: Akio Itoh, Saitama, Japan

[73] Assignee: Jeco Co., Ltd., Japan

[21] Appl. No.: 137,462

[22] Filed: Dec. 23, 1987

[30] Foreign Application Priority Data

Dec. 27, 1986 [JP] Japan ............................ 61-202461[U]

[51] Int. Cl.$^4$ ........................ G01R 1/20; G01R 5/20; G01R 11/30
[52] U.S. Cl. .................................... 324/150; 324/144
[58] Field of Search ............... 324/144, 143, 146, 150, 324/154 R, 167; 340/658, 670, 870.02; 250/231 SE

[56] References Cited

U.S. PATENT DOCUMENTS

4,314,146 2/1982 Berney ................................ 324/100

FOREIGN PATENT DOCUMENTS

104576 6/1984 Japan .................................... 324/144

Primary Examiner—Reinhard J. Eisenzopf
Assistant Examiner—Anthony L. Miele
Attorney, Agent, or Firm—Remy J. VanOphem

[57] ABSTRACT

An indicator includes an indicating member driving unit, an encoder plate, a rotational position detecting unit, and an indication position control unit. The indicating member driving unit rotates an indicating member mounted on a rotor shaft in accordance with an electrical signal input to cause the indicating member to indicate. The encoder plate rotates in association with the indicating member. The rotational position detecting unit detects an actual indication position of the indicating member on the basis of a rotational amount of the encoder plate. The indication position control unit controls the indication position of the indicating member so that the actual indication position of the indicating member detected by the rotational position detecting unit coincides with an indication position of the indicating member determined in correspondence to the electrical signal input.

11 Claims, 8 Drawing Sheets

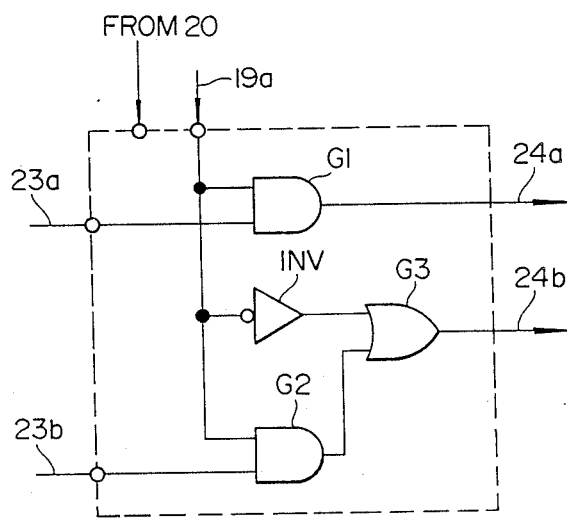
FIG. IA
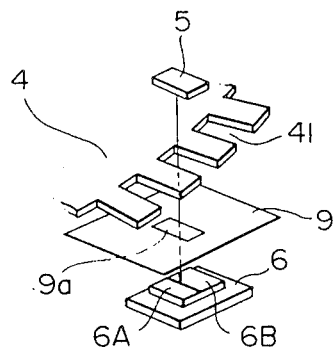
FIG. 4

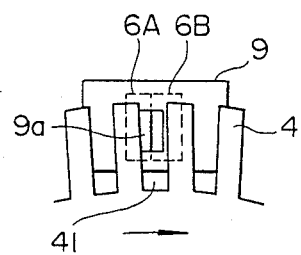 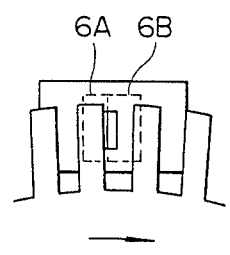
FIG. 5a  FIG. 5b
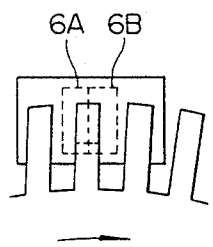 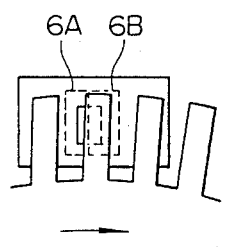
FIG. 5c  FIG. 5d

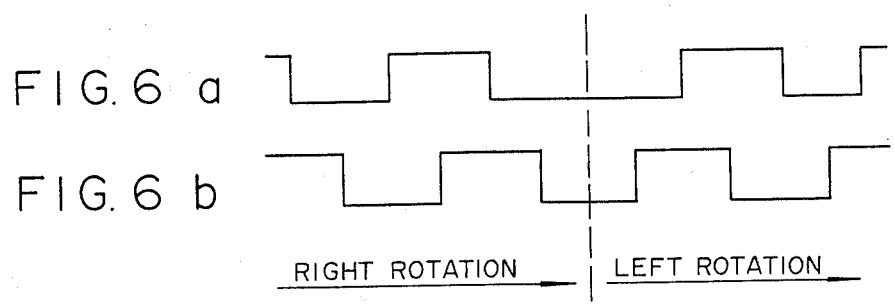
FIG. 6 a
FIG. 6 b
RIGHT ROTATION | LEFT ROTATION
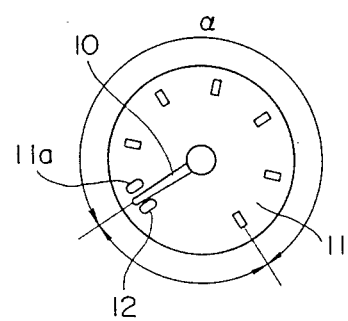
FIG. 7

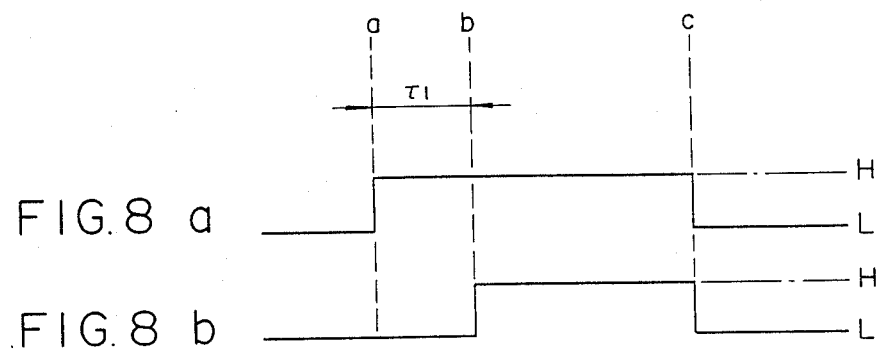
FIG. 8 a
FIG. 8 b
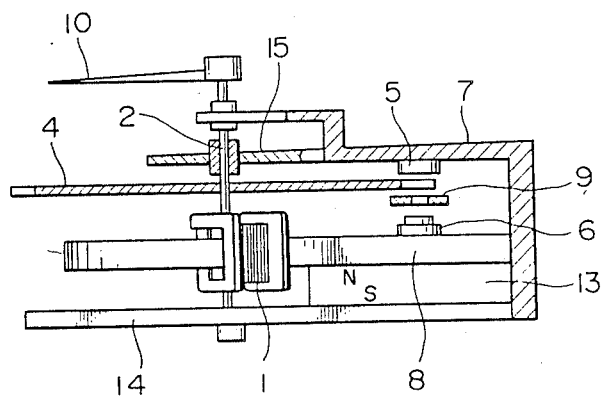
FIG. 9

ELECTRICAL INDICATOR HAVING AN OPTICAL POSITION ENCODER

BACKGROUND OF THE INVENTION

1. Field of the Invention

The present invention relates to an indicator such as a tachometer which can be suitably used to measure the number of revolutions of an engine or a speed of a vehicle detected as a rotational speed, a thermometer, an ammeter, a voltmeter, and the like.

2. Description of the Prior Art

Conventional indicators of this type are, for example, an indicator using a cross coil indicator as disclosed in Japanese Utility Model Laid-Open No. 59-144567, an indicator using a movable coil indicator as disclosed in Japanese Utility Model Laid-Open No. 59-134071, and an indicator using a stepping motor.

Of the above conventional indicators, according to the cross coil indicator, a frequency must be converted into a voltage and two-phase sine wave and cosine wave currents must be supplied to a coil with respect to a voltage signal. However, sine wave/cosine wave conversion is very difficult and costly, and hysteresis is increased very much due to abrasion and the like of a bearing portion when the amplitude of each wave is around 0. In addition, linearity is degraded by imbalance of a rotor system including a pointer, also the accuracy of the electrical circuit and magnetic circuit are adversely affected by temperature changes, resulting in very poor indicating accuracy.

The movable coil indicator has problems as described in Japanese Utility Model Laid-Open No. 59-144567. In addition, a bearing portion is abraded, linearity is degraded by imbalance of a rotor system including a pointer, and accuracy of all the circuits including the magnetic circuit is degraded by temperature changes and deterioration over time, resulting in very poor indicating accuracy. Moreover, since fine adjustment is required, the indicator becomes expensive.

In addition, the movable coil indicator indicates at a point where a torque obtained by an input value and applied on a pointer is balanced with a spring incorporated in the indicator. Therefore, in order to improve accuracy, the operational speed of the pointer is reduced. Moreover, nonlinear regions are always present at upper and lower limits of an indicating range. Therefore, in order to obtain accurate indication, the indicator must not be used in these regions but in a narrow range with good linearity. In addition, since no force acts on the pointer at the point where a torque balance between the input value and the spring is obtained, indicating variations tend to occur due to vibrations and the like. The above-mentioned indicating linearity often depends on the type of spring used in the indicator. For this reason, a hair spring with relatively high linearity is used, resulting in high cost and variations in products caused by temperature changes. Therefore, indicating accuracy of only about 1% can be obtained.

Since the indicator using a stepping motor is generally controlled by a microcomputer or the like, not only a motor but also a control circuit becomes expensive. In addition, when an indicator of this type is applied to, e.g., a vehicle, the motor tends to be detuned due to intense vibration or impact and hence an indication error occurs. In this case, the system cannot be recovered until it is reset.

SUMMARY OF THE INVENTION

It is, therefore, a principal object of the present invention to provide an indicator which has better response characteristics and higher indicating accuracy than those of a conventional indicator.

It is another object of the present invention to provide a movable coil indicator in which indicating accuracy can be increased regardless of characteristic degradation in a magnet.

In order to achieve the above objects of the present invention, there is provided an indicator having indicating member driving means for rotating an indicating member mounted on a rotor shaft in accordance with an electrical signal input to cause the indicating member to indicate, an encoder plate rotating in association with the indicating member, rotational position detecting means for detecting an actual indication position of the indicating member on the basis of a rotational amount of the encoder plate, and indication position control means for controlling the indication position of the indicating member so that the actual indication position of the indicating member detected by the rotational position detecting means coincides with an indication position of the indicating member determined in relation to the electrical signal input.

BRIEF DESCRIPTION OF THE DRAWINGS

FIG. 1A is a circuit diagram of a zero-returning circuit of FIG. 1;

FIG. 4 is a perspective view of a main part showing a relationship between an encoder plate mounted on a rotor shaft of the torquer and light-emitting and light-receiving elements;

FIGS. 5a to 5d are plan views showing how a notch groove of the encoder plate passes by an opposing slit;

FIGS. 6a and 6b are waveform charts of signals sent from the light-receiving element of the encoder plate when the notch groove thereof passes by;

FIG. 7 is a plan view of a dial portion of the torquer shown in FIG. 2;

FIGS. 8a and 8b are waveform charts of a monitored voltage which is monitored by a power source voltage monitoring circuit and an output signal which is sent in accordance with the monitored voltage;

FIG. 9 is a side sectional view of a torquer in which a hair spring is additionally provided to forcibly stop a pointer at its minimum deflection angle position;

DETAILED DESCRIPTION OF THE PREFERRED EMBODIMENT

Figure 2:
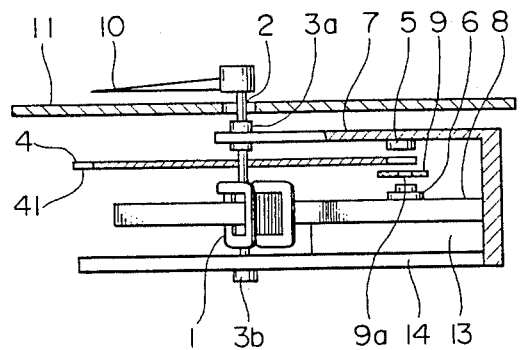
FIG. 2 is a side sectional view of a torquer used in the indicator of FIG. 1.
Figure 3:
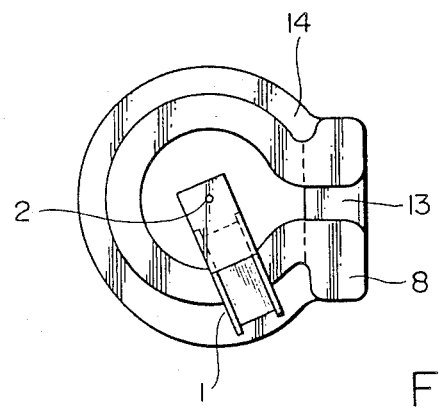
FIG. 3 is a plan view of a magnetic circuit of the torquer in FIG. 2.

An indicator according to the present invention will be described below with reference to the accompanying drawings. FIG. 2 is a side sectional view of an indication portion (to be referred to as a torquer hereinafter; this portion is also called a servo-actuator or a force-motor) of an embodiment of the indicator, and FIG. 3 is a plan view of a magnetic circuit of the torquer. This torquer is obtained by removing a hair spring from a movable coil indicator. When a current is supplied to a torquer coil 1, a clockwise or counterclockwise rotational torque is generated in correspondence to a direction of the current, and a rotor shaft 2 is rotated about bearings 3a and 3b.

An encoder plate 4 is mounted on the rotor shaft 2 and is rotated integrally therewith. Notch grooves 41 (FIG. 4) are formed in the entire circumferential edge of the encoder plate 4. The notch grooves 41 have a constant pitch and substantially uniform widths. A light-emitting element 5 and a light-receiving element 6 are arranged above and below a passing track of the notch grooves 41 of the encoder plate 4 so as to oppose each other. The light-emitting element 5 is fixed to a box member 7 which serves as a cover of the torquer. The light-receiving element 6 is fixed to a U-shaped yoke 8. A slit plate 9 is fixed to the yoke 8 and arranged between the light-receiving element 6 and the encoder plate 4. A slit 9a having a width substantially half that of the pitch of the notch grooves 41 is formed at a substantially central portion of the slit plate 9. That is, a light beam from the light-emitting element 5 reaches the light-receiving element 6 through the slit 9a. The light-receiving element 6 is constituted by two light-receiving elements 6A and 6B which are symmetrical about& the central line of the slit 9a and each of which incorporates an amplifier. By the light-receiving elements 6A and 6B, accurate rotational position and direction of the rotor shaft 2 can be measured. That is, as shown in FIGS. 5a to 5d, when the encoder plate 4 is rotated, outputs from the light-receiving elements 6A and 6B become signal waveforms having a phase difference therebetween as shown in FIGS. 6a and 6b in accordance with rotation of the encoder plate 4. Therefore, rotational direction and angle of the encoder plate 4 can be calculated on the basis of a phase state of the signal waveforms of both outputs and an up/down count of pulses. As a result, an accurate position of the rotor shaft 2 can be measured. An incremental encoder unit is constituted by the encoder plate 4, the light-emitting element 5, the light-receiving element 6, and the slit plate 9.

A pointer 10 is attached to the distal end portion of the rotor shaft 2, and a dial plate 11 is arranged below the pointer 10. As shown in a plan view of FIG. 7, an indication scale of a rotational speed is printed within a predetermined rotational angle range α on a circumferential edge of the dial plate 11, so that a measured rotational speed can be read at a rotational angle position indicated by the distal end portion of the pointer 10 which is rotated together with the rotor shaft 2. A stopper 12 extends from a start position (in this embodiment, a zero indication position of a rotational speed) 11a of the rotational speed indication scale of the dial plate 11. When the pointer 10 is rotated and abuts against the stopper 12, further reverse rotation (left rotation in FIG. 7) of the pointer 10 is regulated by the stopper 12. That is, a position regulated by the stopper 12 corresponds to a minimum deflection angle position of the pointer 10, and over-returning of the pointer 10 is limited by this position. When the torquer is arranged upright in a gravity direction, a rotational force in a reverse rotational direction acts on the pointer 10 by the gravity acting on a rotor system including the pointer 10. Therefore, in an initial state (natural state) prior to an actual operation, the pointer 10 abuts against the stopper 12 by the rotational force caused by the gravity and stays at the minimum deflection angle position by the rotational force which continuously acts thereon. That is, the center of gravity of the rotor system is set such that the pointer 10 always returns to the minimum deflection angle position in the natural state wherein the torquer is arranged upright in the gravity direction so that the dial plate 11 faces a front side. Note that in FIGS. 2 and 3, reference numeral 13 denotes a permanent magnet; and 14 denotes a base plate which constitutes, together with the permanent magnet 13 and the yoke 8, a magnetic circuit.

Figure 1:
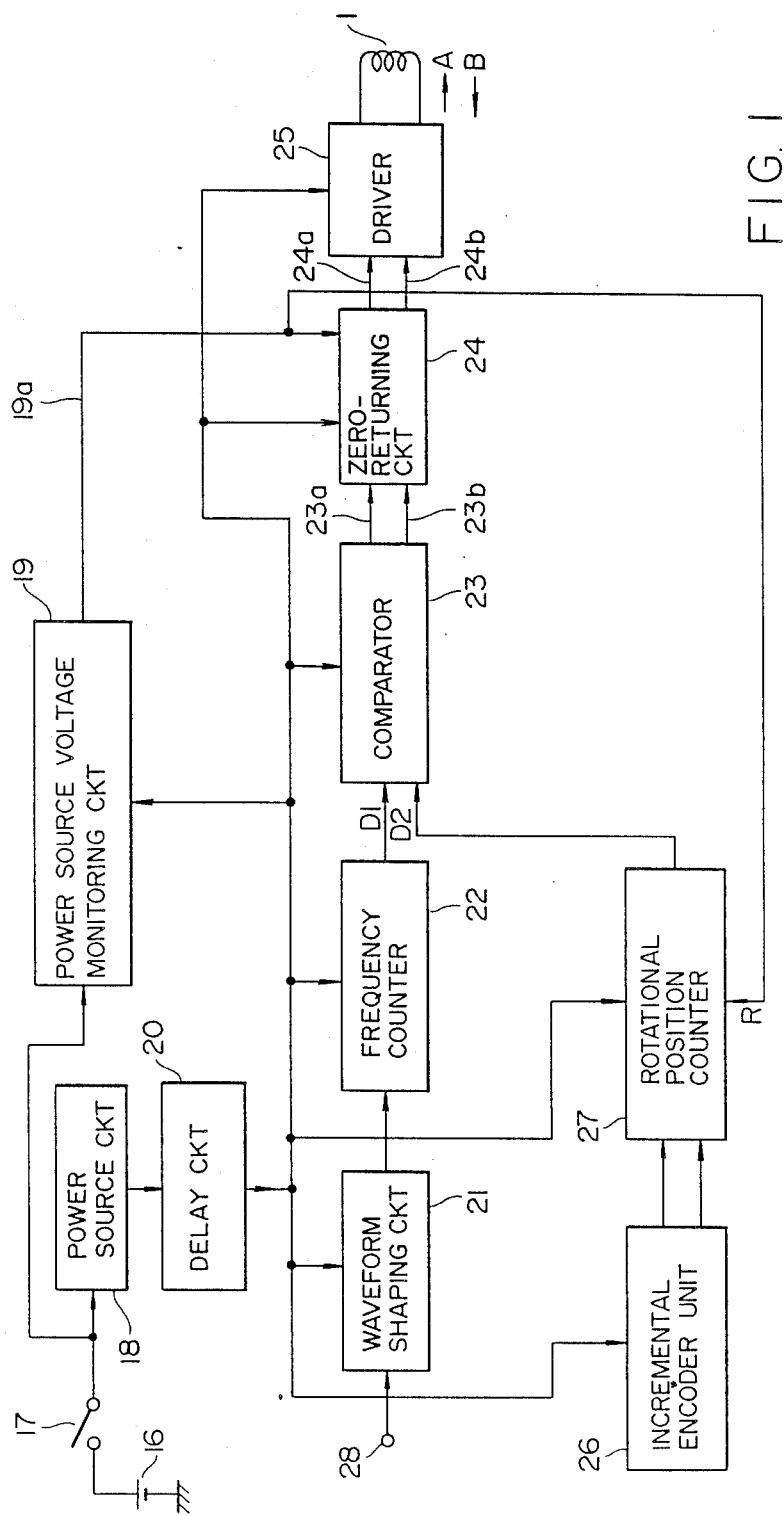
FIG. 1 is a block diagram of an embodiment of an indicator according to the present invention.

FIG. 1 is a block diagram showing a drive controller of the torquer coil 1 in the torquer having the above arrangement. A power source voltage from a main power source 16 is applied to a power source circuit 18 through a main power switch 17, and a voltage value of the power source voltage applied to the power source circuit 18 is monitored by a power source voltage monitoring circuit 19. The power source circuit 18 removes noise components and the like of the power source voltage and applies it to a waveform shaping circuit 21, a frequency counter 22, a comparator 23, a zero-returning circuit 24, a driver 25, an incremental encoder unit 26, a rotational position counter 27, and the power source voltage monitoring circuit 19 through a delay circuit 20. Note that in this block diagram, the incremental encoder unit 26 is an encoder unit constituted by the encoder plate 4, the light-emitting element 5, the light-receiving element 6, and the slit plate 9, all described above with reference to FIG. 2.

The power source voltage monitoring circuit 19 generates an output signal as shown in FIG. 8b in accordance with an input state (FIG. 8a of the power source voltage to be monitored and supplies it to the zero-returning circuit 24 and the rotational position counter 27. That is, when the main power source switch 17 is closed and the main power source voltage is applied to the power source circuit 18, the monitored voltage of the power source voltage monitoring circuit 19 is increased (shown at a point a in FIGS. 8a and 8b. That is, the power source voltage monitoring circuit 19 detects an increase in monitored voltage and sends an output signal of level "H" at a point b which is delayed from the point a by a time interval of 1. When the power source switch 17 is opened and the monitored voltage falls (to a point c in FIGS. 8a and 8b, the output signal supplied so far is immediately switched from level "H" to "L".

A detection signal having a frequency corresponding to a rotational speed to be measured is input to the waveform shaping circuit 21 through an input terminal 28. The detection signal shaped by the waveform shaping circuit 21 is input to the frequency counter 22 and then is input to one terminal of the comparator 23 as, e.g., 8-bit digital data corresponding to its frequency. A fundamental frequency of the frequency counter 22 is generated by a quartz oscillator so as to eliminate a measurement error caused by a temperature difference.

An output from the incremental encoder unit 26 is input to the rotational position counter 27. The rotational position counter 27 performs up or down count in accordance with a rotational direction of the rotor shaft 2. As a result, an actual rotational angle position of the rotor shaft 2 is input to the other terminal of the comparator 23 as, e.g., the 8-bit digital data. Note that the rotational position counter 27 is reset by level "L" of a signal input thereto through the power source voltage monitoring circuit 19, and output data with respect to the comparator 23 is set at zero by this resetting.

The comparator 23 compares the data inputs from the frequency counter 22 and the rotational position counter 27 and sends a logic output as shown in Table 1 to the zero-returning circuit 24 in accordance with a comparison result. The zero-returning circuit 24 supplies, in addition to the logic output from the comparator 23, a logic output as shown in Table 2 to the driver 25 in accordance with a level of the output signal from the power source voltage monitoring circuit 19. The driver 25 controls supply of a current to the torquer coil 1 in a state as shown in Table 2 in accordance with the logic outputs supplied thereto.

TABLE 1

| Mode | Input Data | 23a | 23b |
|---|---|---|---|
| 1 | D1 D2 | "H" | "L" |
| 2 | D1 D2 | "L" | "H" |
| 3 | D1 = D2 | "L" | "L" |

TABLE 2

| | Inputs | | | Outputs | | Torquer Coil |
|---|---|---|---|---|---|---|
| Mode | 23a | 23b | 19a | 24a | 24b | Current |
| 1 | — | — | L | L | H | Direction A |
| 2 | H | L | H | H | L | Direction B |
| 3 | L | H | H | L | H | Direction A |
| 4 | L | L | H | L | L | Short |

Note that in Table 1, reference symbol D1 denotes an input data value input through the frequency counter 22; D2, an input data value input through the rotational position counter 27; and reference numerals 23a and 23b, output signal lines of the comparator. In Table 2, reference numerals 24a and 24b denote output signal lines of the zero-returning circuit 24; and 19a, an output signal line of the power source voltage monitoring circuit 19. The directions A and B in Table 2 represent directions of the current supplied to the torquer coil 1 in FIG. 1, and "short" means that the torquer coil 1 is disconnected from the power source and short-circuited. By flowing the current through the torquer coil 1 in the direction A, the rotor shaft 2 is reversely rotated, and by flowing the current in the direction B, the rotor shaft 2 is forwardly rotated. That is, the zero-returning circuit 24 used in this embodiment is basically constituted by two AND gates G1 and G2, an OR gate G3, and an inverter INV. Input terminals of the AND gate G1 are connected to the output signal line 19a of the power source voltage monitoring circuit 19 and the output signal line 23a of the comparator 23, and input terminals of the AND gate G2 are connected to the output signal line 19b of the power source voltage monitoring circuit 19 and the output signal line 23b of the comparator 23. The input terminal of the inverter INV is connected to the output signal line 19a of the power source voltage monitoring circuit 19, and the output terminal thereof is connected to an input terminal of the OR gate G3. An output from the AND gate G2 is supplied to the other input terminal of the OR gate G3. The output terminal of the OR gate G3 is connected to the output signal line 24b. The output terminal of the AND gate G1 is connected to the output signal line 24a. In this arrangement, a logic operation of Table 2 is performed.

An operation of the indicator having the above arrangement will be described below. That is, when the power source switch 17 is closed and the power source voltage is applied, the power source voltage is applied to the respective circuits through the delay circuit 20 after a predetermined delay time $\tau2$. In this case, the delay time $\tau1$ of the power source voltage monitoring circuit 19 is set longer than the delay time $\tau2$ of the delay circuit 20. Therefore, when the rotational position counter 27 is reset and its output data becomes zero, a signal of level "L" is input to the zero-returning circuit 24, and the zero-returning circuit 24 sends a logic output of mode 1 to the torquer coil 1 in accordance with the logic of Table 2. That is, a current is supplied to the torquer coil 1 in a direction to forcibly and reversely rotate the rotor shaft 2. In this case, the time $\tau1$ of the power source voltage monitoring circuit 19 during which a signal of level "L" is output is set longer than a time obtained by adding the delay time $\tau2$ of the delay circuit 20 with a time $\tau3$ required for the pointer 10 to return from the maximum deflection angle position to the minimum deflection angle position ($\tau1 \geq \tau2 + \tau3$). For this reason, the pointer 10 is returned to and is kept at the minimum deflection angle position by a reverse torque generated in the torquer coil 1, and a position of the pointer 10 and a count value of the rotational position counter 27 are accurately initialized. After the time $\tau1$ has elapsed, an output level from the power source voltage monitoring circuit 19 goes to "H", and a normal operation is started.

The normal operation will be described below. That is, a detection signal of a frequency corresponding to the rotational speed to be measured supplied to the input terminal 28 is input to the frequency counter 22 through the waveform shaping circuit 21 and then is input to one input terminal of the comparator 23 as digital data corresponding to its frequency. In the initial state wherein the pointer 10 stays at the minimum deflection angle position, the incremental encoder unit 26 does not output its detection signal. Therefore, output data supplied from the rotational position counter 27 is zero, and a comparison result obtained by the comparator 26 is a logic of mode 1 shown in Table 1. Therefore, since this logic output is input to the zero-returning circuit 24 and a signal of level "H" is also input thereto through the power source voltage monitoring circuit 19, the logic output of the zero-returning circuit 24 is supplied as a logic of mode 2 shown in Table 2. By this logic output, a current in the direction B is supplied to the torquer coil 1 through the driver 25, and the rotor shaft 2 is forwardly rotated. Upon forward rotation of the rotor shaft 2, the incremental encoder unit 26 starts supply of the detection signal, and on the basis of this detection signal, the rotational position counter 27 starts up/down count. A drive current in the direction B is continuously supplied to the torquer coil 1 until the output data from the rotational position counter 27 coincides with the output data from the frequency counter 22 in accordance with the logic of Tables 1 and 2. When both the output data coincide with each other, the output from the comparator 23 becomes a logic output of mode 3 shown in Table 1. As a result, the output from the zero-returning circuit 24 becomes a logic output of mode 4 in Table 2, and the torquer coil 1 is short-circuited. Therefore, rotation of the rotor shaft 2 is braked by a generating effect caused by this short circuit, and generation of a torque from the torquer coil 1 is stopped. Thus, a rotational angle position of the pointer 10 is accurately determined on the dial plate 11, and a measured value of the rotational speed is indicated at the rotational angle position of the pointer 10. In this state, when the center of gravity of the rotor system is unbalanced or the rotor shaft 2 is rotated due to an external vibration or the like, the output data from the rotational position counter 27 changes. Therefore, a correction current in the direction A or B is generated in the torquer coil 1 and holds the rotor shaft 2 at a position determined in accordance with the output data from the frequency counter 22. When the output data from the frequency counter 22 changes in accordance with the frequency of the detection signal supplied to the input terminal 28, a drive current in the direction A or B is generated in the torquer coil 1 in correspondence to the value of the output data, and the rotor shaft 2 is held at a new position corresponding to the frequency of the detection signal. As described above, according to the indicator of the present invention, some kind of a servo system is constructed, and the pointer 10 can be accurately held at a target rotational angle position while always feeding back an actual rotational angle position.

When the power source switch 17 is opened and application of the power source voltage is interrupted, the output from the power source voltage monitoring circuit 19 is immediately switched from level "H" to "L". Therefore, the rotational position counter 27 is reset, and the zero-returning circuit 24 starts supplying of the logic output of mode 1 in Table 2 again. That is, the delay circuit 20 is arranged to continuously supply the power source voltage to the respective circuits for a predetermined time interval even after the power source switch 17 is opened. For this reason, similar to the case wherein the power source switch 17 is closed, a current in the direction A is supplied to the torquer coil 1, and the pointer 10 is forcibly returned to the minimum deflection angle position by this current.

Note that in the above embodiment, the power source voltage monitoring circuit 19 monitors abrupt rising or falling of the power source voltage caused by turning on/off of the main power source switch 17, and the output signal of the waveform as shown in FIG. 8b is supplied. However, the output signal may be supplied on the basis of rising or falling which exceeds a predetermined value (threshold value) of the power source voltage. With this arrangement, a voltage drop due to excessive consumption of a battery can be prevented. Moreover, in the above embodiment, the pointer 10 is held at the minimum deflection angle position by an effect of gravity in the natural state. However, as shown in FIG. 9, an arrangement may be made such that one end of a hair spring 15 is fixed to the box member 7 and the other end thereof is fixed to the rotor shaft 2 so that the pointer 10 is forcibly held at the minimum deflection angle position against an elastic force of the hair spring 15.

As described above, according to the indicator of the above embodiment, since accuracy of the indicator is determined by manufacturing accuracy of the encoder plate 4 and conversion accuracy of the frequency, uniform and high accuracy can be obtained throughout a measuring range. In addition, since the torquer need only generate a forward/reverse rotation torque, changes in magnetic circuit, rotational imbalance of the rotor system, a frictional force of the rotor bearing portion, and the like are not associated with accuracy at all. Therefore, a rigid and simple structure can be obtained, and hence manufacturing cost can be reduced. Moreover, if the pointer is accelerated by a vibration or impact and indicates a wrong value, the pointer can be immediately returned to an accurate position by the incremental encoder unit 26 which can accurately respond to a mechanical vibration of the rotor system thereby effectively preventing an indication error.

Since all the measurements and control operations are performed using digital amounts, the circuits, the rotor system, and the torquer are not adversely affected by temperature changes or deterioration over time and hence can be manufactured without adjustment. Therefore, the indicator according to the present invention can be arranged at very low cost using a gate array IC and the like. Furthermore, by only additionally providing a comparator, additional circuits such as a rotational speed alarm can be advantageously arranged with high accuracy at low cost. As a result, the height of the indicator of the present invention can be reduced to about ⅔ that of a conventional movable coil indicator, resulting in a compact, light, and thin indicator.

As has been described above, according to the indicator of the present invention in which the pointer is rotated in accordance with a measured rotational speed and the rotational speed is indicated at a rotational angle position of the pointer, the encoder plate is provided to rotate in association with the pointer, an actual rotational angle position of the pointer is detected on the basis of a rotational amount of the encoder plate, the detected actual rotational angle position of the pointer is compared with a target rotational angle position of the pointer which is determined in correspondence to the measured rotational speed, and the pointer is rotated so that the actual rotational angle position coincides with the target rotational angle position. Therefore, a servo system is constructed so that a deflection angle position of the pointer accurately coincides with the target rotational angle position on the basis of the actual rotational angle position. As a result, the indicator of the present invention can be made compact and light in weight at low cost as compared with a conventional indicator and, therefore, can be used in conditions wherein disturbance, such as a vibration or impact, are present.

In the above arrangement, indicating accuracy is determined in accordance with accuracy of a slit formed in the encoder plate and hence can be improved to about 10 times that of the conventional indicator. In addition, by using a gear mechanism in combination with a movable coil indicating mechanism or a mechanism having the same function, the indicating accuracy can be further improved. Furthermore, at any rotational angle position, an indication error of the same amount is obtained.

It is a matter of course that the present invention is not limited to the above embodiment but can be variously modified. For example, in the above embodiment, digital detection signals having a frequency associated with a rotational speed are used as signals to be supplied to input terminals. More specifically, these detection signals are an ignition pulse or an ignition signal of an engine ignition unit, an engine crankshaft rotation pickup pulse, a transmission rotation pickup pulse (speedometer signal), and the like. In addition, the present invention can be applied not only to an indicator but also to any apparatus in which an electrical signal input is changeable regardless of whether the signal is analog or digital. In this case, if the electrical signal input is an analog input, the waveform shaping circuit 21 of FIG. 1 is replaced with an input circuit which matches impedances of a unit for supplying the analog input and an indicator, and the frequency counter of FIG. 1 is replaced with an A/D converter. The analog inputs mentioned here are a voltage signal, a current signal, a temperature signal, or a pressure signal, an atmospheric pressure signal associated with an altitude, and the like.

In the above embodiment, the slit plate 9 is arranged between the light-receiving element 6 and the encoder plate 4. However, the slit plate 9 may be omitted.

Figure 10:
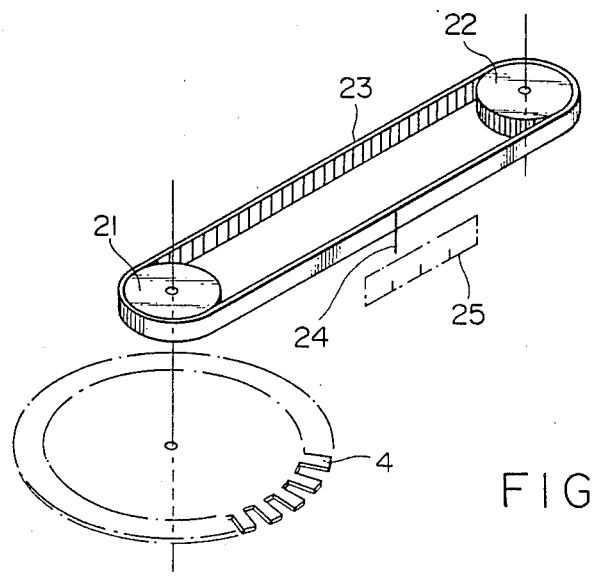
FIG. 10 is a perspective view of a mechanism using a combination of a pulley, a belt and a pointer.

In addition, in the above embodiment, the pointer is used as an indicating member. However, known indicating structures such as a disk indication element, a slide indication element, and a mechanism using a combination of a pulley, a belt, and a pointer may be similarly used to perform the same operation. For example, FIG. 10 is a perspective view of a mechanism using a combination of a pulley, a belt, and a pointer, in which only a portion different from the structure shown in FIG. 2 is illustrated. In FIG. 10, a gear pulley 21 is fixed to a rotor shaft 2, and a belt 23 extends between the gear pulley 21 and a gear pulley 22. A pointer 24 is mounted on the belt 23 to perform predetermined indication in association with an indication plate 25.

Figure 11:
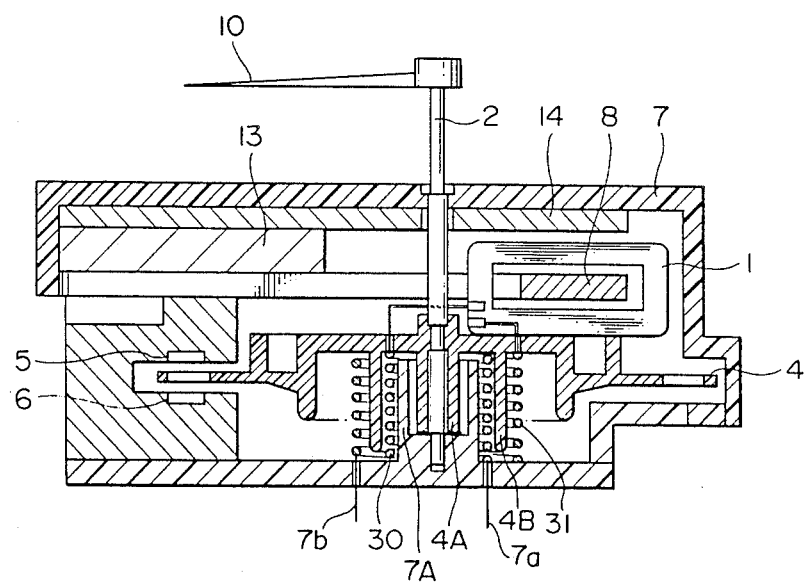
FIG. 11 is a side sectional view of a torquer in which a coil spring is used in place of the hair spring.
Figure 12:
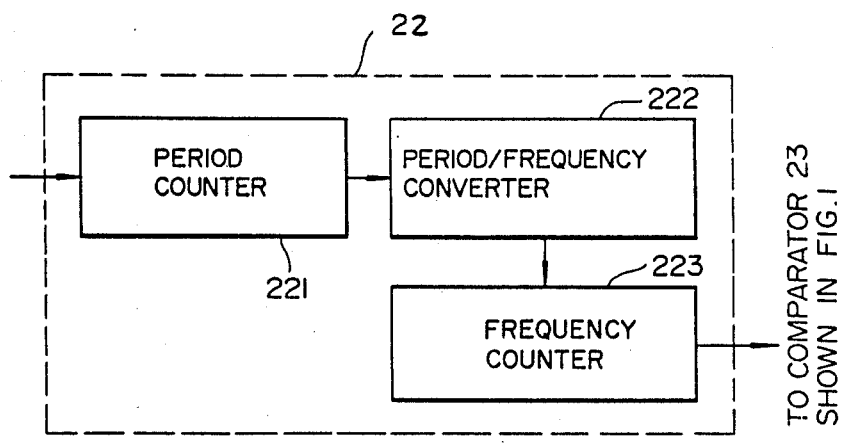
FIG. 12 is a circuit diagram showing an arrangement of a frequency counter 22.

In FIG. 9, a hair spring is used to return the pointer 10 to the minimum deflection angle position. However, in an arrangement shown in FIG. 11, a coil spring can be similarly used. The same parts or the parts having the same functions as in FIG. 9 are denoted by the same reference numerals in FIG. 11. In FIG. 11, the encoder plate 4, which is arranged above the torquer coil 1 in FIG. 9, is arranged therebelow. Two cylinders 4A and 4B concentrically extend downward from the encoder plate 4. The inner cylinder 4A serves to stably fix the encoder plate 4 to the rotary shaft. A cylindrical member 7A extending upward from the box member 7 is inserted between the cylinder 4A and the outer cylinder 4B, and a first coil spring 30 is arranged between the cylindrical member 7A and the cylinder 4B. The first lower end of the first coil spring 30 is connected to a terminal 7a projecting outward from the box member 7, and the upper end thereof is connected to one end of the torquer coil 1 through the encoder plate 4. A coil spring 31 having a diameter larger than that of the first coil spring 30 is arranged outside the cylinder 4B. The lower end of the coil spring 31 is connected to a terminal 7b projecting outward from the box member 7, and the upper end thereof is connected to the other end of the torquer coil 1 through the encoder plate 4. Since the coil spring can be used, this arrangement can be made at lower cost than that wherein a conventional hair spring is used. In addition, noise of the hair spring can be eliminated. In the embodiment shown in FIG. 1, pulse frequency signals are used as signals to be supplied to the input terminals. However, it is a matter of course that periodic pulse signals may be similarly used. In this case, a frequency counter 22 having an arrangement shown in FIG. 12 is used. That is, the frequency counter 22 includes a period counter 221 for counting periods of periodic pulse input signals, a period/frequency converter 222 for converting the periodic pulse input signals into pulse frequency signals associated with a period on the basis of an output from the period counter 221, and a frequency counter 223 for counting outputs from the converter 222. An output from the counter 223 is supplied to the comparator 23.

What is claimed is:

1. An indicator responsive to a received input signal comprising:
   an indicating member;
   indicating member driving means for rotating said indicating member in response to an electrical signal;
   an encoder plate mechanically linked to said indicating member and rotatable therewith;
   rotational position detecting means responsive to the rotation of said encoder plate to generate an encoded signal corresponding to the rotational position of said indicating member; and
   indication position control means responsive to the received input signal and said encoder signal to generate said electrical signal activating said indicating member driving means to rotate said indicating member to the position indicated by the received input signal.

2. An indicator according to claim 1, wherein said indicating member is a pointer.

3. An indicator according to claim 1, wherein said indicating member comprises a first pulley mounted on said indicating member driving means, a second pulley arranged apart from said first pulley, a belt extending between said first and second pulleys, and a pointer mounted on said belt.

4. An indicator according to claim 1, further comprising initial position setting means for defining an initial position of said indicating member, wherein after said indicating member engages with said initial position setting means, said indicating member stays at the initial position by an effect of gravity.

5. An indicator according to claim 4, further comprising an elastic member, mounted on said indicating member driving means, for forcibly holding said indicating member at the initial position after said indicating member engages with said initial position setting means.

6. An indicator according to claim 4, wherein said received input signal is a series of pulse signals, said indicator further comprising counting means for counting said pulse signals, to generate a coded input signal and said indication position control means has comparing means for comparing said encoded signal generated by said rotational position detecting means with said coded input signal generated by said counting means.

7. An indicator according to claim 6, wherein said indication position control means has biasing means responsive to a power source switching turned on, to activate said indicating member driving means to rotate said indicating member to engage with said initial position setting means.

8. An indicator according to claim 6, wherein said indicating member driving means has a fixed yoke and a coil which is pivotal through said fixed yoke and mounted on said indicating member driving means and wherein said indication control means short circuits said coil when said encoded signal is equal to said received input signal.

9. An indicator according to claim 1, further comprising initial position setting means for defining an initial position of said indicating member, and an elastic member, mounted on said rotary shaft, for forcibly holding said indicating member at the initial position after said indicating member engages with said initial position setting means.

10. An indicator according to claim 1, wherein said rotational position detecting means optically detects the rotation of said encoder plate to generate said encoded signal.

11. An indicator according to claim 1, wherein the electrical signal input is a value associated with an engine operation.

* * * * *

UNITED STATES PATENT AND TRADEMARK OFFICE
CERTIFICATE OF CORRECTION

PATENT NO. : 4,879,510

DATED : November 7, 1989

INVENTOR(S) : Akio Itoh

It is certified that error appears in the above-identified patent and that said Letters Patent is hereby corrected as shown below:

Column 3, line 28, delete "about&" and insert ---- about ----.

Column 4, line 35, after "8a" insert ---- ) ----.

Column 4, line 42, after "8b" insert ---- ) ----.

Column 4, line 48, after "8b" insert ---- ) ----.

Column 5, line 53, delete "19b" and insert ---- 19a ----.

Column 8, line 3, after "accurately" insert ---- and rapidly ----.

Column 8, line 4, after "spond" insert ---- electrically ----.

In the Claims

Column 10, line 44, delete "switching" and insert ---- switch being ----.

UNITED STATES PATENT AND TRADEMARK OFFICE
CERTIFICATE OF CORRECTION

PATENT NO. : 4,879,510

DATED : November 7, 1989

INVENTOR(S) : Akio Itoh

It is certified that error appears in the above-identified patent and that said Letters Patent is hereby corrected as shown below:

Column 10, line 58, delete "rotary shaft" and insert ---- indicating member driving means ----.

Signed and Sealed this

Twenty-sixth Day of March, 1991

Attest:

HARRY F. MANBECK, JR.

Attesting Officer

Commissioner of Patents and Trademarks